United States Patent
Wang et al.

(10) Patent No.: US 8,878,707 B1
(45) Date of Patent: Nov. 4, 2014

(54) TIME-INTERLEAVED SKEW REDUCED PIPELINED ANALOG TO DIGITAL CONVERTER

(71) Applicant: Broadcom Corporation, Irvine, CA (US)

(72) Inventors: Tao Wang, Costa Mesa, CA (US); Chun-Ying Chen, Irvine, CA (US); Massimo Brandolini, Mission Viejo, CA (US); Wei-Te Chou, Lake Forest, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/967,819

(22) Filed: Aug. 15, 2013

Related U.S. Application Data

(60) Provisional application No. 61/845,858, filed on Jul. 12, 2013.

(51) Int. Cl.
*H03M 1/00* (2006.01)
*H03M 1/12* (2006.01)

(52) U.S. Cl.
CPC ............ *H03M 1/002* (2013.01); *H03M 1/1245* (2013.01)
USPC ............................ 341/122; 341/161; 341/172

(58) Field of Classification Search
CPC ............................... H03M 1/44; H03M 1/164
USPC .................................... 341/122, 161–162, 172
See application file for complete search history.

(56) References Cited

U.S. PATENT DOCUMENTS

| | | | | |
|---|---|---|---|---|
| 7,339,512 | B2 * | 3/2008 | Gulati et al. | 341/172 |
| 7,602,324 | B1 * | 10/2009 | Huang et al. | 341/131 |
| 7,626,524 | B2 * | 12/2009 | Horie | 341/141 |

* cited by examiner

*Primary Examiner* — Khai M Nguyen
(74) *Attorney, Agent, or Firm* — Brinks Gilson & Lione

(57) ABSTRACT

A system includes a first storage element to store an input signal for a first sampling lane for a SHA-less stage. A first switch is connected with the first storage element, the first switch to control when the first storage element stores the input signal for sampling on the first sampling lane. A second switch is connected in series with the first switch, the second switch to control an instance for sampling the input signal stored on the first storage element for the first sampling lane.

20 Claims, 12 Drawing Sheets

US 8,878,707 B1

TIME-INTERLEAVED SKEW REDUCED PIPELINED ANALOG TO DIGITAL CONVERTER

PRIORITY CLAIM

This application claims priority to U.S. Provisional Application Ser. No. 61/845,858, filed Jul. 12, 2013, which is incorporated herein by reference in its entirety.

TECHNICAL FIELD

This disclosure relates to analog to digital converters. This disclosure also relates to the time-interleaved skew reduced, pipelined analog to digital converters that may also be SHA-less.

BACKGROUND

An analog-to-digital converter (ADC) includes an electronic device that receives an analog signal. The analog-to-digital converter samples the received signal and outputs a signal representing a digital value. The digital value may be acquired in operations whose outputs represent a number of bits. The ADC may be used to sample a variety of analog waveforms in the form of radio-frequency wave, sound waves, or voltage signal.

BRIEF DESCRIPTION OF THE DRAWINGS

The innovation may be better understood with reference to the falling drawings and description. In the figures, like reference numerals designate corresponding parts throughout the different views.

DETAILED DESCRIPTION

Battery-mode operation of full-band capture systems can be enabled if the power dissipation is controlled. For high-speed, wide-band analog to digital converters (ADC), a major amount of power can be consumed in the sample and hold amplifier (SHA) stage. This stage may also include noise and signal distortion. Additionally, time-interleaved systems may suffer from clock skew. To mitigate the performance degradation due to clock skew, either a global sampling technique or power consuming digital correction circuitry may be needed. Using a combination of the global sampling technique and the SHA-elimination technique can help control power consumption and mitigate clock skew.

The discussion below makes reference to user equipment that can implement a SHA-less, skew reduced, pipelined ADCs described herein. User equipment may take many different forms and have many different functions. As one example, user equipment may be a 2G, 3G, or 4G/LTE cellular phone capable of making and receiving wireless phone calls, and transmitting and receiving data. The user equipment may also be a smartphone that, in addition to making and receiving phone calls, runs any number or type of applications. User equipment may be virtually any device that transmits and receives information, including as additional examples a driver assistance module in a vehicle, an emergency transponder, a pager, a satellite television receiver, a networked stereo receiver, a computer system, music player, or virtually any other device. The techniques discussed below may also be implemented in a base station or other network controller that communicates with the user equipment.

Figure 1:
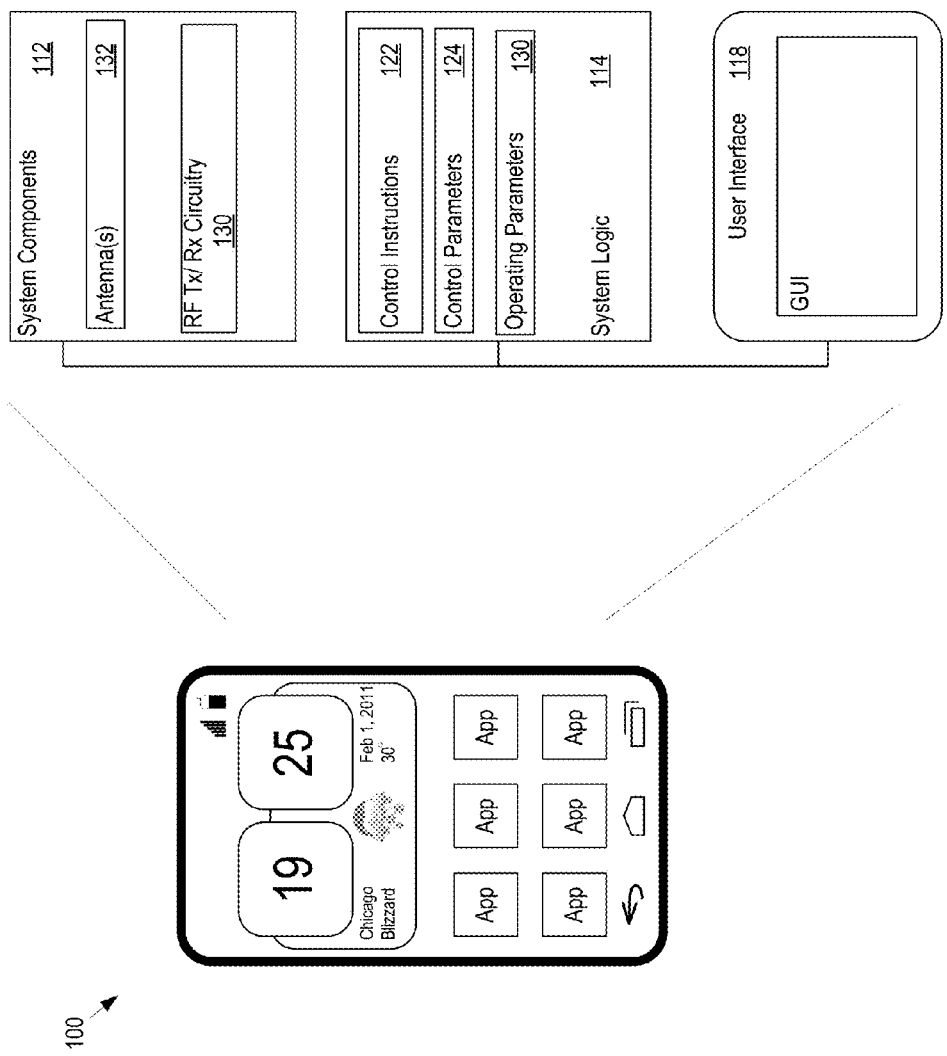
FIG. 1 shows an example of user equipment that includes an analog to digital converter.

FIG. 1 shows an example of user equipment (UE) 100. The user equipment 100 can include among other things system components 112, system logic 114 and a user interface 118. System logic 114 can be part of the implementation of desired functionality in the UE 100. In that regard, the system logic 114 may include logic that facilitates, as examples, running applications; accepting user inputs; saving and retrieving application data; establishing, maintaining, and terminating cellular phone calls or data connections for, as one example, Internet connectivity; establishing, maintaining, and terminating wireless network connections, Bluetooth connections, or other connections; and displaying relevant information on the user interface 118. The user interface 118 may include a graphical user interface (GUI), touch sensitive display, voice, facial and gesture recognition inputs, buttons, switches, speakers and other user interface elements.

The system logic 114 can include control instructions 122, control parameters 124 and operating parameters 130, e.g., for implementing the SHA-less and/or skew-less pipelined ADC and for controlling the system components 112. The system components 112 may be implemented, for example, in a system on a chip (SoC), application specific integrated circuit (ASIC), or other circuitry. In the system components 112, Radio Frequency (RF) transmit (Tx) and receive (Rx) circuitry 130 handles transmission and reception of signals through the antenna(s) 132.

Figure 2:
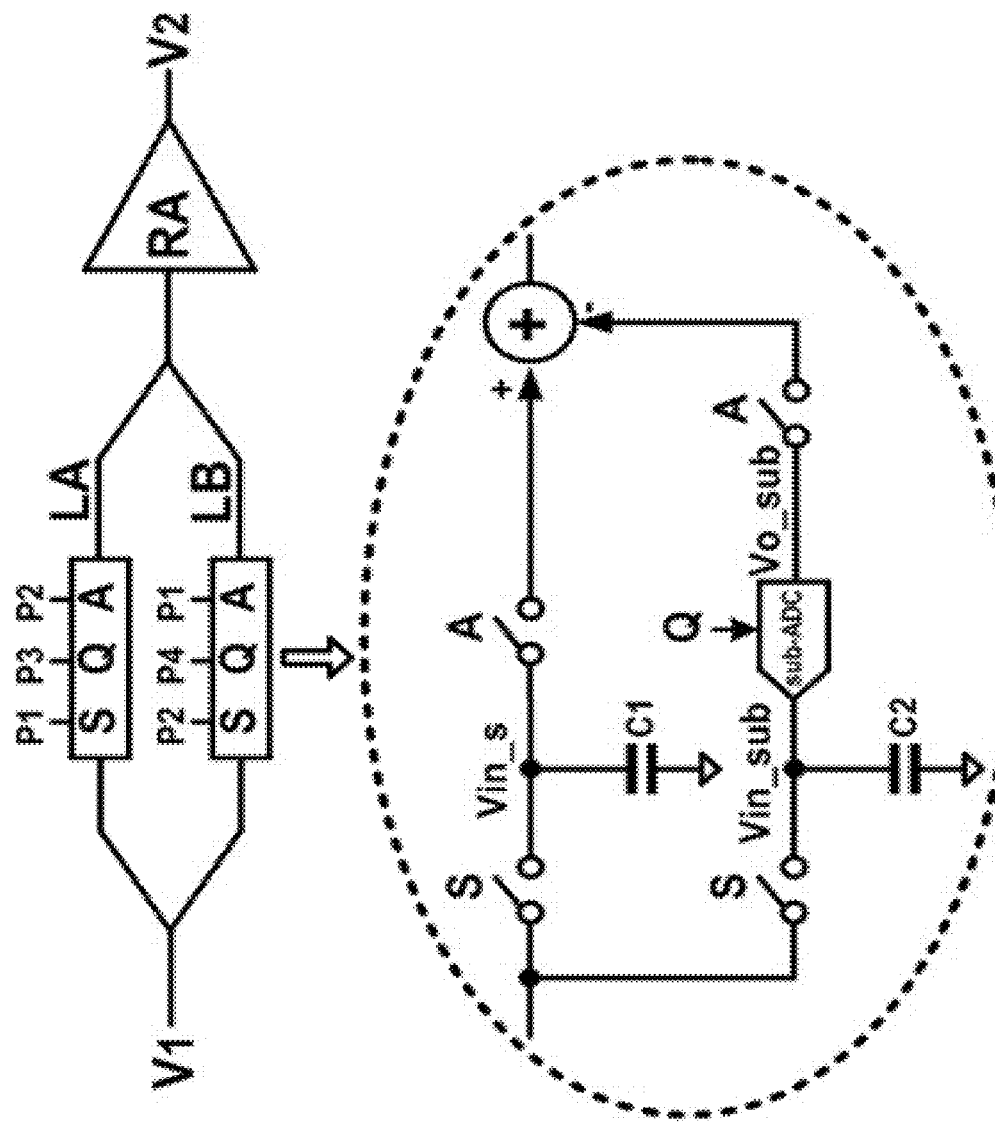
FIG. 2 is a circuit diagram of an exemplary first stage of a pipelined ADC.

FIG. 2 is a circuit diagram of an exemplary first stage of a pipelined ADC 200. In a ping-pong, pipelined ADC, "S" is the input signal sampling, "Q" is the sub-ADC quantization, and "A" is the residue amplification by using the residue amplifier (RA) 202. The circuit 204 details the inside lane A/B. The RA amplifies the difference between the sampled input signal Vin_s 206 and the sub-ADC output Vo_sub 208. The sampling switches 210 and amplification switches 212 control when sampling and amplification occur, respectively. Therefore, quantization Q can be completed before amplification A occurs.

Figure 3:
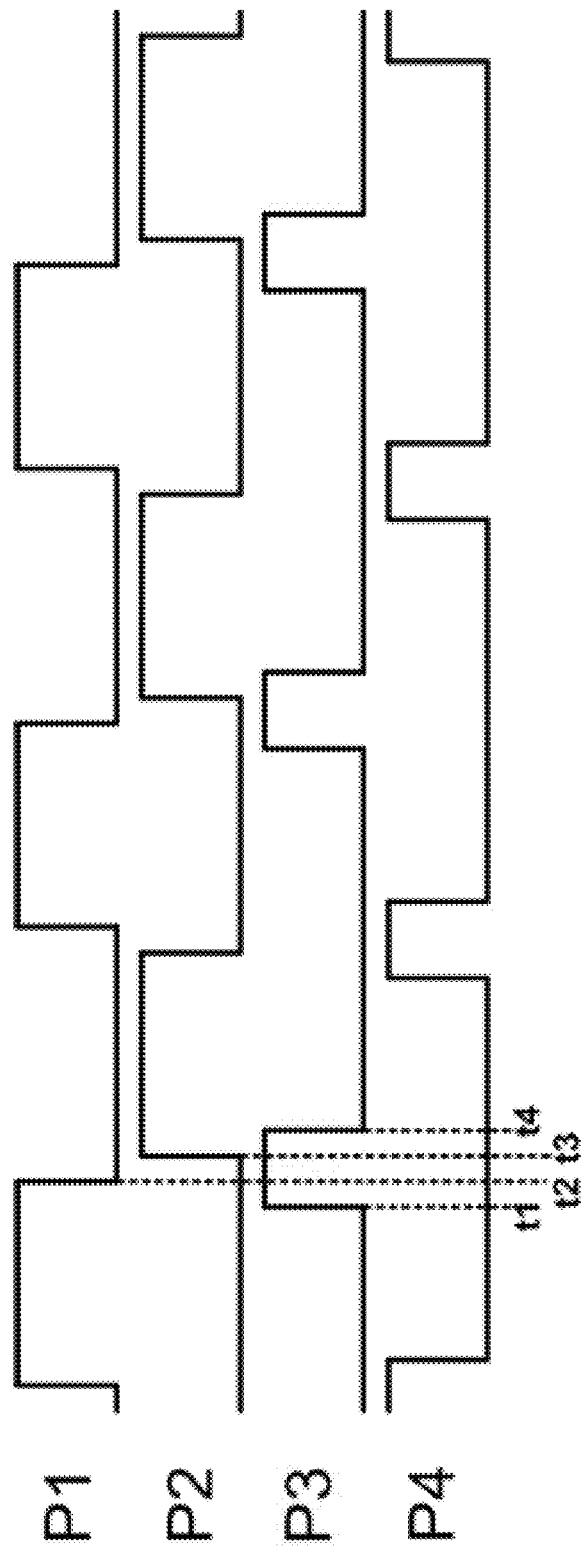
FIG. 3 is an exemplary timing diagram for the circuits in FIG. 2.

FIG. 3 is an exemplary timing diagram for the circuits in FIG. 2. The upper lane LA 214 performs sampling S in phase P1, amplification A in phase P2 and quantization Q in P3. The lower lane LB 216 performs sampling S in phase P2, amplification A in phase P1 and quantization Q in P4. The RA operates in both phases P1 and P2, and is shared between two lanes LA 214 and LB 216, e.g., in a time-interleaved way.

In high-speed applications, the time period t3–t2 (non-overlapping time between P1 and P2) may not be enough for quantization Q. Some approaches may try to increase t3–t2 by either advancing t2 to t1 or delaying t3 to t4. In the first case, with a continuously moving input signal without a SHA, Vin_s 206 and Vin_sub 208 may be different since their corresponding sampling instants are different (t2 and t1). This can result in an over-ranged first stage output. In the second case, the time for amplification A is reduced by amount t4–t3, which may result in a higher speed requirement of the RA. Additionally or alternatively, an ADC 200 with more than one lane and SHA-less operation may suffer from clock skew.

Figure 4:
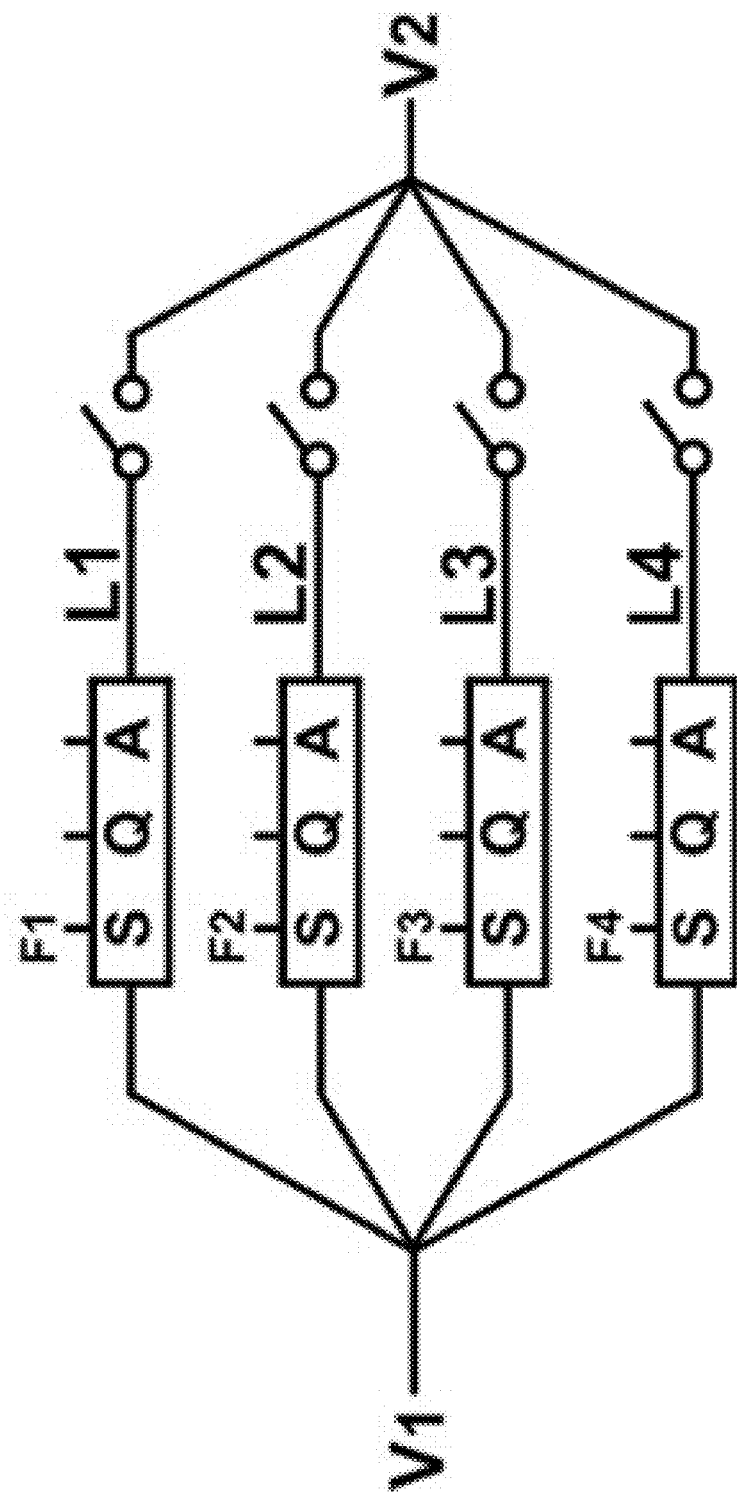
FIG. 4 shows a circuit diagram of an example skew reduced and/or SHA-less time-interleaved pipelined ADC.

FIG. 4 shows a circuit diagram of an example skew reduced and/or Sha-less time-interleaved pipelined ADC 400. The ADC 400 includes a determined number of lanes, e.g., four lanes L1 402, L2 404, L3 406 and L4 408. More or less lanes may be used depending on an implementation. The lanes L1 402, L2 404, L3 406 and L4 408 can perform sampling S, quantization Q and amplification A on input signal V1 410 and output a signal V2 412. A timing of the sampling S, quantization Q and amplification A is controlled by clock signals F.

Figure 5:
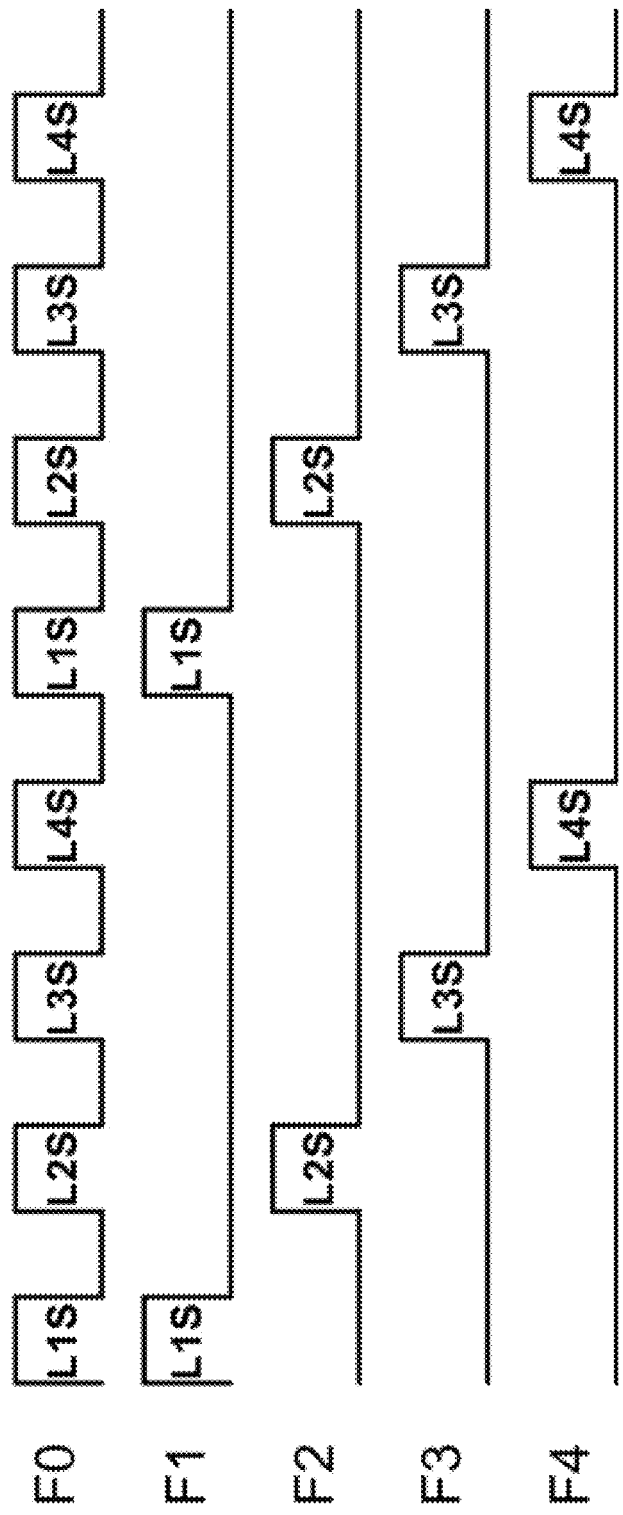
FIG. 5 shows an exemplary timing diagram of the example skew reduced and/or SHA-less pipelined ADC of FIG. 4.

FIG. 5 shows an exemplary timing diagram of the skew reduced and/or SHA-less pipelined ADC 400 of FIG. 4. When F1 is high, lane L1 402 performs sampling S, when F2 is high, lane L2 performs sampling S, when F3 is high lane L3 performs sampling S and when S4 is high lane 4 performs sampling S. Clock signal F0 can be used to control skew. The falling edges of F0 occur slightly before the corresponding falling edges of F1/F2/F3/F4, so that the sampling instants of four lanes are controlled by the single clock F0, resulting in clock skew reduced operation.

Figure 6:
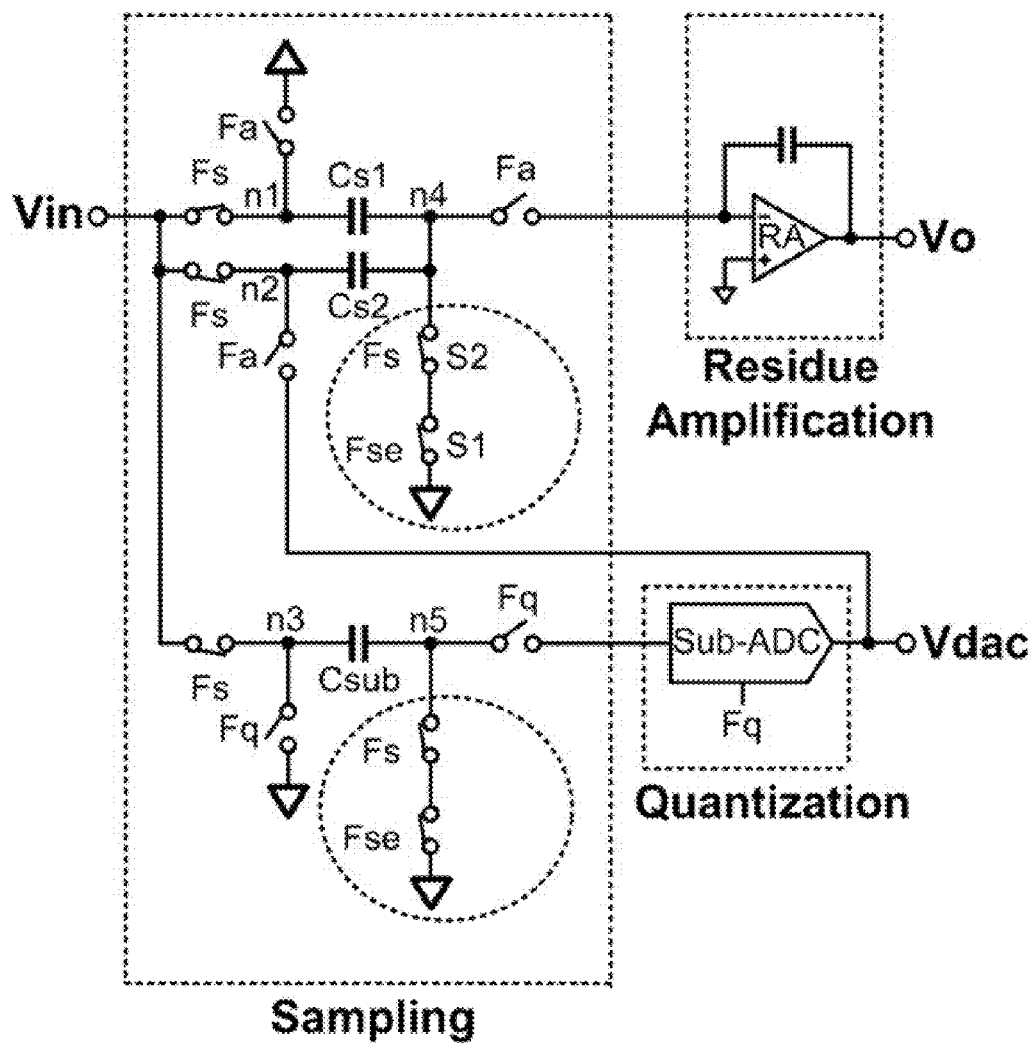
FIG. 6 is a circuit diagram of an exemplary lane circuit for the skew reduced and/or SHA-less time-interleaved pipelined ADC of FIG. 4.

FIG. 6 is a circuit diagram of an exemplary sampling circuit 500, e.g., lane 1 the skew reduced and/or SHA-less time-interleaved pipelined ADC 400 of FIG. 4. To reduce power consumption and/or lessen clock skew, serial switches S1 and S2 may be used together in the sampling circuit 500 to time the sampling of input signal Vin. One switch, e.g., switch S2, may be switched based on a clock signal for sampling Fs, e.g., F1 of FIG. 5, for lane 1 of the interleaved system. Each lane can receive an individual Fs clock signal, e.g., F1, F2, F3 and F4.

The lanes L1/L2/L3/L4 of the time-interleaved pipelined, e.g., ADC 400 of FIG. 4, can be skew-less or reduced skew by including another switch, e.g., switch S1 of FIG. 6. Switch S1 switches based on a global clock Fse signal, e.g., F0 in FIG. 5. The sampling circuit 500 can represent one lane, e.g., lane 1 in the interleaved sampling. The sampling in all the lanes L1/L2/L3/L4 is synchronized to the global clock signal Fse as one clock signal is assigned for all lanes of the time interleaved system. The falling edge of Fse (F0 in FIG. 5) comes slightly earlier than the corresponding edge of Fs, e.g. F1/F2/F3/F4. Therefore, the input signal is sampled onto both Cs1 and Cs2 at the falling edge of Fse, instead of Fs. Since the same clock (F0 in FIG. 5) is assigned to Fse in all four lanes L1/L2/L3/L4, the clock skew in a time-interleaved system can be resolved. When switches S1 and S2 are closed, the sampling occurs at a proper time for the lane (switch S2) and without skew (switch S1). Serial switches S1 and S2 together can also be implemented by other components, e.g., multi-gate finfet/mosfet devices.

Additionally or alternatively, the ADC 400 can also be SHA-less. The Vin signal is held on capacitor Cs1 and capacitor Cs2 upon signal F1 (FIG. 5) for lane 1 sampling. During the phase when clock sampling signal Fs is high, the bottom plate of Cs1 (node n1) and the bottom plate of Cs2 (node n2) are connected with Vin. The top plates of Cs1 and Cs2 (node n4) are connected to AC ground via the two serial switches S1 and S2 (closed switches in the dashed circles) which are controlled by Fs and Fse, respectively. The capacitor Csub can sample the same way. Since the global clock signal Fse is used to control the time of sampling for Cs1 and Csub, there is no need to place a SHA preceding the circuit, resulting in SHA-less operation.

A residue amplification stage 502 can connect with node 4. A switch Fa can control timing for amplification of the sampled signal. The residue amplification stage can output signal Vo. Output signal Vo is the amplified difference between the input signal Vin and the quantized signal Vdac.

A dedicated full clock phase Fq may be used for the quantization Q stage 504, thus the speed requirement on the sub-ADC may be greatly relaxed compared to systems in FIG. 2. At the falling edge of Fq, the sub-ADC can start quantization. The sub-ADC quantization can also begin after the falling edge of Fs, if top-plate sampling is used in the sub-ADC sampling. The SHA-less design may allow for power saving and the lane interleaving provides for high-speeds of the wide-band ADC's, e.g., in the multiplying digital to analog converter (MDAC) or successive approximation (SAR) ADC stage.

In one example, total power dissipation can be reduced, e.g., about halved, by using this SHA-less architecture and additional power reduction can occur due to the clock skew reduced operation. Power utilizing digital clock skew error correction circuitry can be eliminated and better noise and distortion performance may be achieved with the same power dissipation. For the same power dissipation, the speed of the ADC can be faster, e.g., two times faster, than other ADC's that are not using this architecture. During exemplary chip measurements of the time-interleaved skew reduced and/or SHA-less technique, the total harmonic distortion (THD) may not degrade abruptly with increasing input signal frequency. For chip de-cap, de-layer, a clock tree layout may use multiple clock phases.

Other advantages may include that the chip area of the ADC may be reduced due to SHA-less operation. Background calibrations may not be needed to compensate the voltage difference between Vin_s and Vin_sub if SHA-less operation is enabled, and residue amplification time or the input sampling time to perform sub-ADC quantization need not be sacrificed. A sampling difference can be eliminated, and both the input sampling time and residue amplification time need not be sacrificed. Clock skew reduced operation is integrated, while maintaining SHA-less operation.

Figure 7:
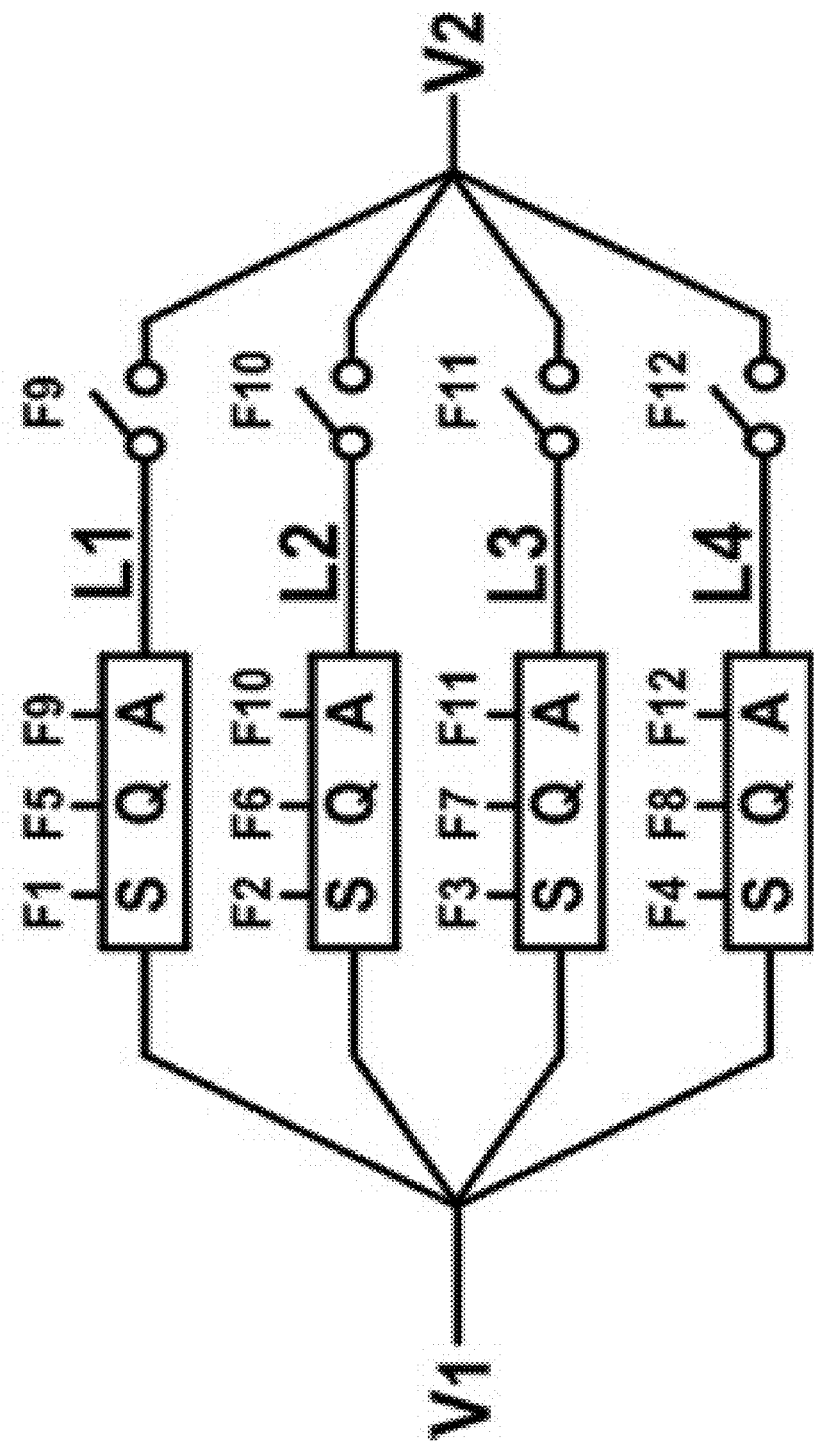
FIG. 7 shows a circuit diagram of an example skew reduced and/or SHA-less time-interleaved pipelined ADC.
Figure 8:
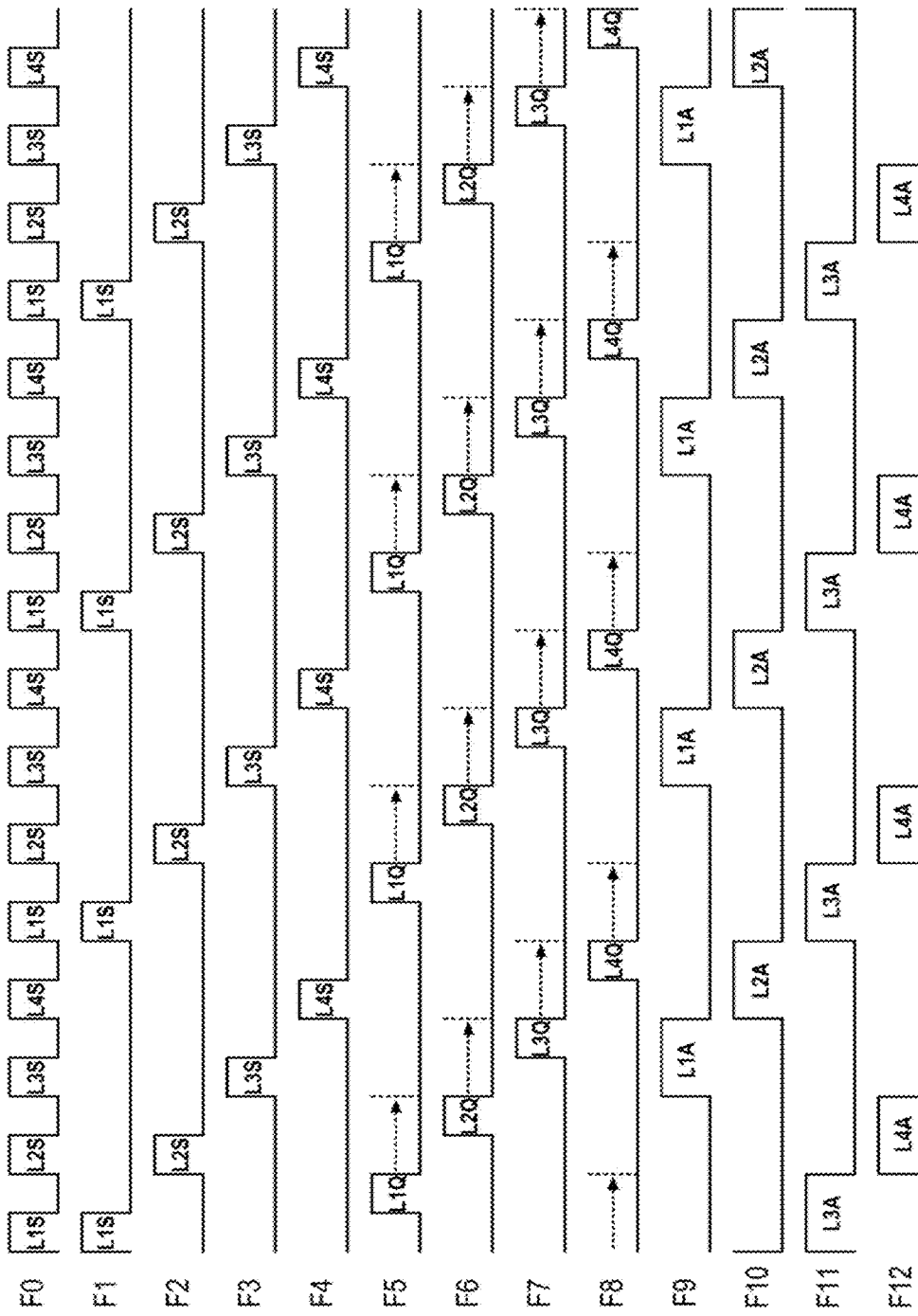
FIG. 8 shows an exemplary timing diagram corresponding to an example skew reduced and/or SHA-less pipelined ADC of FIG. 7.

FIG. 7 shows a circuit diagram of an example skew reduced and/or Sha-less time-interleaved pipelined ADC 400. FIG. 8 shows an exemplary timing diagram corresponding to an example skew reduced and/or SHA-less pipelined ADC of FIG. 7. There are four lanes (L1 through L4). When F1 is high, lane L1 performs sampling S. When F5 is high, lane L1 performs quantization Q. When F9 is high, lane L1 performs amplification A. Other lanes can operate in a similar way. The falling edges of F0 are slightly before the corresponding falling edges of F1/F2/F3/F4, so that the sampling instants of four lanes are controlled by the single clock F0, resulting in clock skew reduced operation.

Referring to FIGS. 6 through 8, since the same signal is sampled onto Cs1 and Cs2, there is no need to put a SHA before the sampling circuit. During the phase when Fq is high, node n3 is connected to AC ground, so −Vin is presented at node n5 for the sub-ADC at the falling edge of Fq. Assuming the frequency and period of F0 is f0 and T0 (T0=1/f0), the sub-ADC quantization time starting from the falling edge of Fq is T0. At the end of sub-ADC quantization, Vdac is available for the residue amplification coming afterwards.

Take lane L1 as an example. At the falling edge of F0 (slightly before F1) the input is sampled onto Cs1, Cs2, and Csub. During the falling phase F5 (L1Q), the voltage present at sub-ADC input is −Vin. The falling edge of F5, triggers the quantization operation of the sub-ADC which is shared between lanes L1 and L3. At the rising edge of F9, the residue amplification begins at L1A. Other lanes can use shifted versions of clocks.

The residue amplifier 502 need not be shared between lanes and can be powered down when not in amplification phase to maintain 100% power efficiency. The sub-ADC also need not be shared between lanes. Compared to other systems where only a small fraction of clock period T0 is used for sub-ADC quantization, this system has T0 for sub-ADC quantization, which may relax the speed and power requirements of the sub-ADC. The quantization time can be further increased if top-plate sampling is used in sub-ADC to start the quantization after the falling edge of Fs. For the residue amplification time (2*T0), the residue amplifier (RA) can be shared between two lanes. The sampling time of about (0.5*T0) may not suffer from clock skew.

The idea can be generally extended to multiple-lane time-interleaved ADCs, where the sampling instants of each lane are synchronized by the same global clock. A determined time period may be allocated for sub-ADC quantization and the rest for residue amplification afterwards. Residue amplifiers and sub-ADCs may be shared between lanes.

Figure 9:
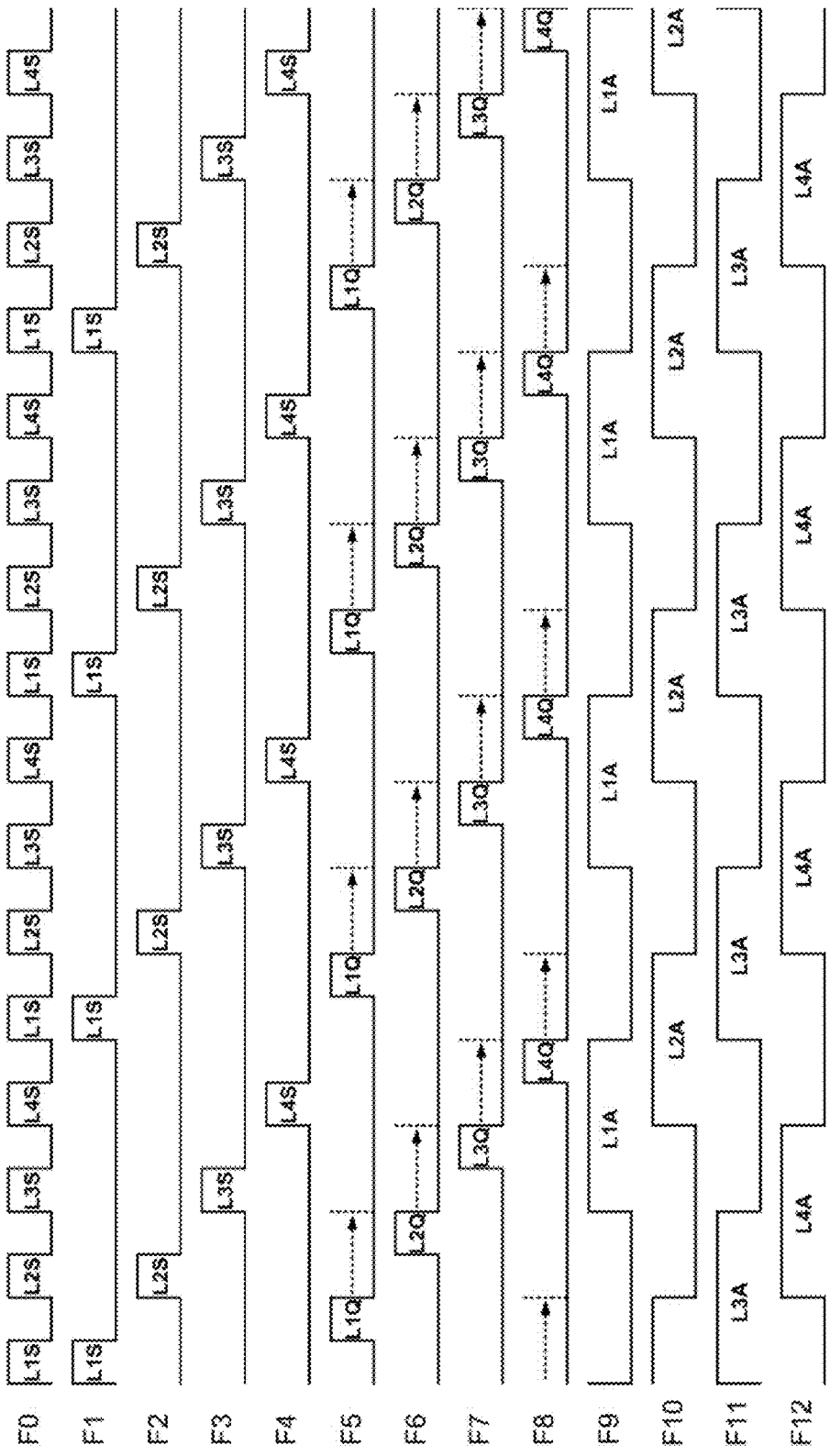
FIG. 9 shows another exemplary timing diagram corresponding to an example skew reduced and/or SHA-less pipelined ADC of FIG. 7.

FIG. 9 shows another exemplary timing diagram corresponding to an example skew reduced and/or SHA-less pipelined ADC of FIG. 7. In FIG. 9, the residue amplifier 502 can be powered down when not in amplification phase to maintain high power efficiency. Two residue amplifiers can be used with one being shared between lanes L1 and L3 and the other being shared between lanes L2 and L4. The residue amplification clocks (F9-F12) can be different from those in FIG. 8 as an alternative to keep residue amplifiers fully occupied. The sub-ADC can also be shared between lanes. The idea can be extended to multiple-lane time-interleaved ADCs, where the sampling instants of each lane are synchronized by the same global clock, with some time allocated for sub-ADC quantization, and the rest for residue amplification afterwards.

Figure 10:
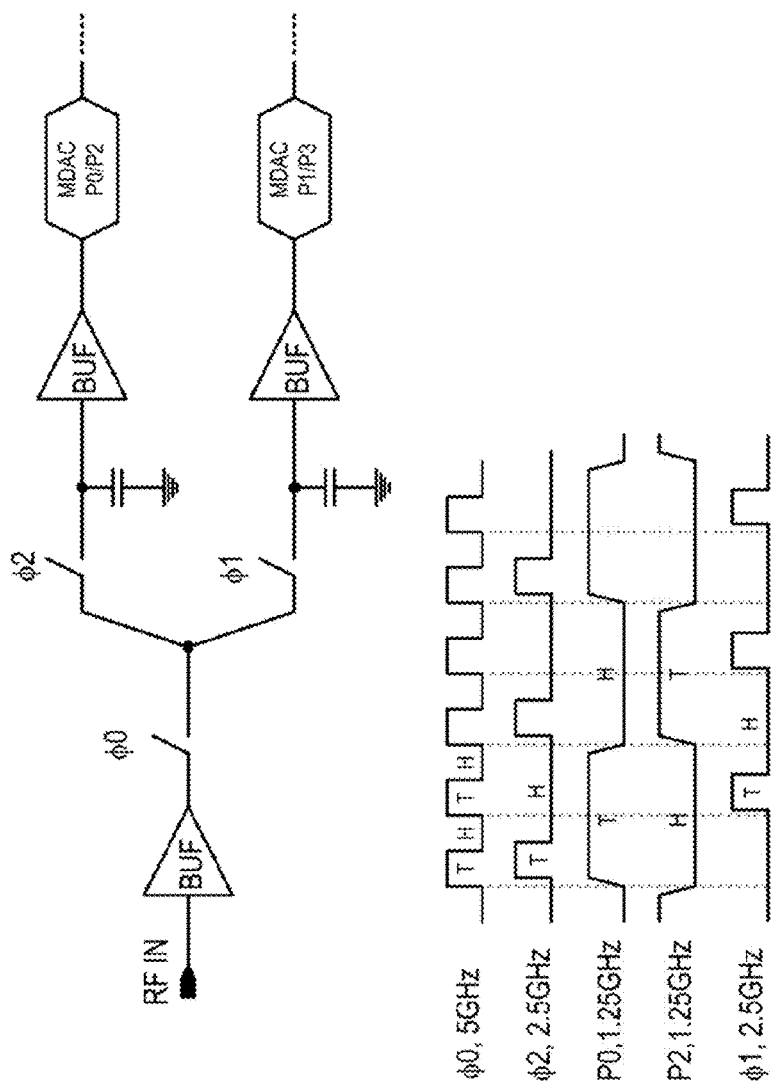
FIG. 10 is a block diagram of an exemplary quantization circuit and exemplary timing diagram for a full-rate sampling with lower speed quantization channels.

FIG. 10 is a block diagram of an exemplary circuit 1100 and exemplary timing diagram for a full-rate sampling with lower speed quantization channels. The circuit 1100 receives a radio frequency input signal (RF IN) which is buffered by input buffer 1102. In this time interleaved system, RF IN can be sent to line 1 including capacitor C1, line one buffer 1106 and MDAC 1110. RF IN is sent to line 1 when switch $\phi 1$ is closed. The circuit 1100 can also include line 2 including capacitor C2, line two buffer 1104 and MDAC 1108. RF IN is sent to line 2 when switch $\phi 2$ is closed. Switch $\phi 0$ connects between the input buffer 1102 and switches $\phi 1$ and $\phi 2$ to avoid or mitigate timing errors that may otherwise require complicated, digital-intensive and power-hungry lane-imbalance corrections (LICs). Such timing errors between the clocks sampling the signal in the N lanes can otherwise also create images of the desired signal, located at fs/N±fin (where fs is the interleaved sampling frequency and fin is the input signal frequency).

The switch $\phi 0$ controlled by signal $\phi 0$ operates at full-speed, e.g., 5 GHz. The switches $\phi 1$ and $\phi 2$ controlled by signals $\phi 1$ and $\phi 2$ interleave the samples onto the capacitors C1 and C2. Because $\phi 0$ is opened earlier than $\phi 1$ and $\phi 2$, the sampling instant is determined by $\phi 0$. Therefore, the timing mismatch between $\phi 1$ and $\phi 2$ do not cause skew or timing errors. By removing timing errors, the only remaining factor that can produce unwanted images is the bandwidth (BW) mismatch between the two interleaved sampling networks. Because the BW is typically made much wider than the max signal frequency, the BW mismatch has a very minor effect, e.g., the image performance can be greatly improved compared to traditional interleaved designs. No digital or analog correction of timing mismatch is necessary, and a reduction in power, area and complexity can be obtained.

The interleaving clocks $\phi 1$ and $\phi 2$ can include a 25% duty-cycle, for example. When $\phi 1$ or $\phi 2$ is high, the sample is stored onto C1 or C2 respectively. When $\phi 0$ goes low, and then $\phi 1$ or $\phi 2$ goes low, and the sample is ready for the quantization that follows (e.g. for an MDAC in a pipeline ADC). The figure shows the timing for an exemplary interleaved MDAC (clocks P0, P2). While the signal is tracked (e.g. $\phi 1$ is high), the amplifier differential outputs can be reset to the common-mode. Benefits of doing this include memory effects are removed and the amplifier power can be reduced, because the worst-case slewing requirement is reduced to half. By resetting, the amplifier holding starts from the common-mode rather than from the previous sample.

Figure 11:
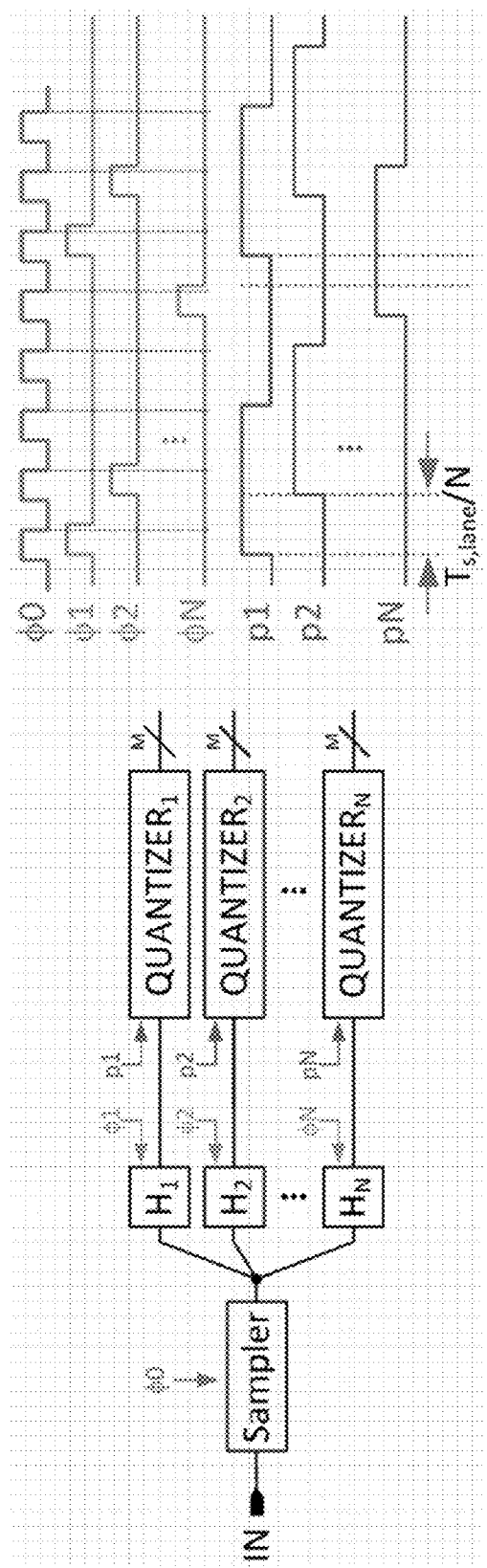
FIG. 11 is a block diagram of the exemplary quantization circuit of FIG. 10 and exemplary timing diagram for N quantization channels.

FIG. 11 is a block diagram of the exemplary quantization circuit 1100 of FIG. 10 and exemplary timing diagram for N quantization channels. The exemplary quantization circuit 1100 can be generalized to an arbitrarily large set of N quantizers. The sampler operates at full speed $\phi 0$, and lower-rate interleaved holding circuits timed $\phi 1$, $\phi 2$ and $\phi N$ interface the sampled data to each quantizer timed P1, P2 and PN. The falling edge of the full-rate clock $\phi 0$ happens earlier with respect to the falling edge of the interleaving holding blocks, e.g., $\phi 0$ determines the sampling instant. The example is for MDAC-based quantizers, but it can be further generalized to any quantizer implementation. The holding blocks are optional and the full-rate sampling operation can be extended to the case of SHA-less interleaved quantizers.

Figure 12:
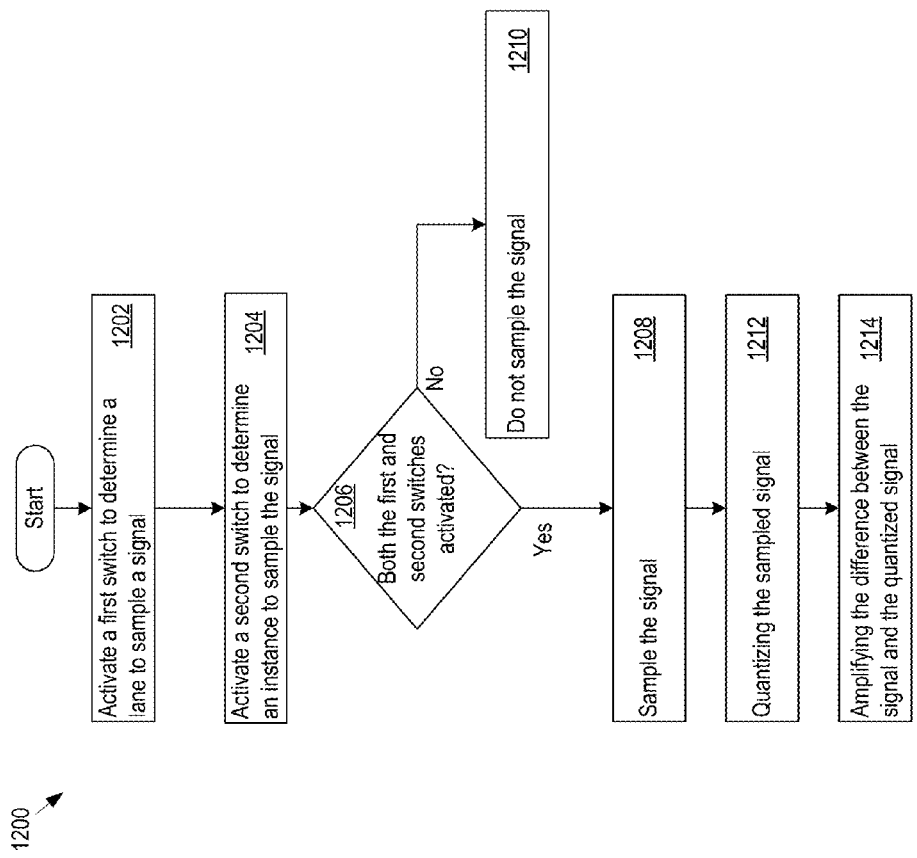
FIG. 12 is an exemplary flowchart 1200 describing a timing for sampling signals.

FIG. 12 is an exemplary flowchart 1200 describing a timing for sampling signals. In an interleaved sampling system, for example the ones described above, a first switch is activated to determine a lane to sample the input signal, e.g., an RF signal (1202). A second switch is activated, e.g., based on a global clock that is same for all lanes of the interleaved system, to determine an instance that the signal is sampled (1204). When both the first switch and the second switch are activated (1206), the signal is sampled for the determined lane (1208). If either the first switch or the second switch are not activated, the signal is not sampled (1210). The sampled signal can be quantized and output as Vdac (1212). The difference between the signal and the quantized signal can be amplified and output as Vo (1214).

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the system may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above.

While various embodiments have been described, it can be apparent that many more embodiments and implementations are possible. Accordingly, the embodiments are not to be restricted.

What is claimed is:

1. A system, comprising:
   a first storage element to store an input signal for a first sampling lane for a SHA-less stage;
   a first switch connected with the first storage element, the first switch to control when the first storage element stores the input signal for sampling on the first sampling lane; and
   a second switch connected in series with the first switch, the second switch to control an instance for sampling the input signal stored on the first storage element for the first sampling lane.

2. The system of claim 1, further including a first clock to generate a first clock signal, the first clock signal to control an instance for switching the first switch.

3. The system of claim 2, where the first switch switches on a falling edge of the first clock signal.

4. The system of claim 1, further including a second clock to generate a second clock signal, the second clock signal to control an instance for switching the second switch.

5. The system of claim 4, further including a second sampling lane for sampling the input signal, where the second clock signal further controls an instance for sampling on the second sampling lane.

6. The system of claim 4, further including a plurality of sampling lanes, where the second clock signal controls an instance for sampling the input signal on the plurality of sampling lanes.

7. The system of claim 1, further including an analog-to-digital converter connected with the input signal, the analog-to-digital converter to quantize the input signal.

8. The system of claim 7, further including a first clock to generate a first clock signal, the first clock signal to control an instance for switching the first switch, and a second clock to generate a second clock signal, the second clock signal to control an instance for switching the second switch.

9. The system of claim 8, further including a second storage element, the second storage element to hold the input signal for quantization.

10. The system of claim 7, further comprising an amplifier connected with an output of the first storage element, the amplifier to amplify a difference between the sampled signal and the quantized signal.

11. The system of claim 1, where the first switch and the second switch comprise a multi-gate finfet or mosfet device.

12. The system of claim 1, where the sampling comprises a SHA-less operation.

13. A method, comprising:
    switching a first switch based on a first clock signal to determine a first lane of the plurality of sampling lanes to be sampled;
    switching a second switch based on a second clock signal to determine an instance to sample to the input signal; and
    sampling an input signal for a plurality of sampling lanes of a SHA-less stage based on the first switch and the second switch.

14. The method of claim 13, where the second clock signal is based on a global clock for the first lane and additional sampling lanes.

15. The method of claim 13 further comprising quantizing the input signal after sampling.

16. The method of claim 15, further comprising amplifying the quantized signal.

17. A quantization circuit, comprising:
    a first lane including a first switch, a first hold element and a first quantizer;
    a second lane including a second switch, a second hold element and a second quantizer;
    a third switch connected between an input for a signal and the first switch and the second switch, the first switch to send the signal to the first quantizer and the second switch to send the signal to the second quantizer, the third switch to control an instance that the signal is sent to the first quantizer or the second quantizer.

18. The quantization circuit of claim 17, further comprising buffers to hold the signal for sampling.

19. The quantization circuit of claim 17, where the capacitor comprises a hold element.

20. The quantization circuit of claim 17, where the first quantizer and the second quantizer comprise a multiplying digital to analog converter.

* * * * *